United States Patent
Li et al.

(10) Patent No.: US 9,490,326 B2
(45) Date of Patent: Nov. 8, 2016

(54) WAFER FORMED BY SLICING AN INGOT

(71) Applicant: SINO-AMERICAN SILICON PRODUCTS INC., Hsinchu (TW)

(72) Inventors: Jian-Jhih Li, Hsinchu (TW); Wen-Ching Hsu, Hsinchu (TW)

(73) Assignee: SINO-AMERICAN SILICON PRODUCTS INC., Hsinchu (TW)

( * ) Notice: Subject to any disclaimer, the term of this patent is extended or adjusted under 35 U.S.C. 154(b) by 0 days.

(21) Appl. No.: 14/698,923

(22) Filed: Apr. 29, 2015

(65) Prior Publication Data

US 2015/0236096 A1    Aug. 20, 2015

Related U.S. Application Data

(62) Division of application No. 13/353,488, filed on Jan. 19, 2012, now Pat. No. 9,051,664.

(51) Int. Cl.
*H01L 29/16* (2006.01)
*C30B 29/06* (2006.01)
*C30B 33/00* (2006.01)
*C30B 33/10* (2006.01)

(52) U.S. Cl.
CPC ............... *H01L 29/16* (2013.01); *C30B 29/06* (2013.01); *C30B 33/00* (2013.01); *C30B 33/10* (2013.01); *Y10T 428/24777* (2015.01)

(58) Field of Classification Search
CPC ....................... Y10T 428/24777; C30B 33/00
See application file for complete search history.

(56) References Cited

U.S. PATENT DOCUMENTS

2009/0061740 A1* 3/2009 Menzel ............... B24B 7/228
451/44

* cited by examiner

*Primary Examiner* — Ian Rummel
(74) *Attorney, Agent, or Firm* — Li & Cai Intellectual Property (USA) Office

(57) ABSTRACT

The instant disclosure relates to a wafer formed by slicing an ingot. The wafer has at least one side surface adjacent to the slicing path and topped with a nanostructure layer.

2 Claims, 6 Drawing Sheets

WAFER FORMED BY SLICING AN INGOT

CROSS REFERENCE TO RELATED APPLICATIONS

This application is a divisional application of Ser. No. 13/353,488 filed on Jan. 19, 2012, entitled "NANOSTRUCTURING PROCESS FOR INGOT SURFACE, WAFER MANUFACTURING METHOD, AND WAFER USING THE SAME", the entire disclosures of which are incorporated herein by reference.

BACKGROUND OF THE INVENTION

1. Field of the Invention

The instant disclosure relates to a wafer; in particular, to a wafer formed by slicing an ingot.

2. Description of Related Art

Information products and appliances utilized in daily life such as cell phones, computer motherboards, micro-processors, memory devices, digital cameras, personal digital assistants (PDA), etc., use integrated circuits (IC). Generally speaking, integrated circuits refer to the use of wafers undergone different semiconductor fabrication processes in creating various individual circuit elements.

The semiconductor fabrication process involves crystallization (ingot forming), surface grinding, slicing, polishing, and cleaning. When the ingot is sliced to form wafers, the slicing process determines how many wafers and chips that can be made in subsequent processes. Therefore, an improvement in the slicing process of the ingot can greatly impact the production capability of the semiconductor industry.

The manufacturing process of silicon wafers typically begins having the ingot undergoing a machining process such as surface grinding followed by slicing. However, for an ingot that is more brittle, the machining process may lead to excessive scraps. Namely, the cutting tools can cause surface cracks for the ingot and form microscopic cracks around the periphery of the wafers. These wafers are more likely to break or crack during subsequent refining processes, resulting lower yield rate.

Additionally, individual wafers are subjected to various external forces during the different refining processes. When these external forces exceed the maximum strength of the wafer or are over-concentrated on the wafer, the wafer may crack or break resulting in a poor yield rate.

SUMMARY OF THE INVENTION

An object of the instant disclosure is to provide a nanostructuring process for an ingot surface and a wafer manufacturing method using the same. The ingot surface is treated in forming nanostructures thereon prior to the slicing process. The nanostructure layer is capable of increasing the surface strength of the ingot to reduce the occurrence of cracking and breaking.

Another object of the instant disclosure is to provide a nanostructuring process for treating an ingot surface. Prior to the ingot being sliced to form wafers, the structuring process is applied to at least one surface of the ingot. Thus, a nanostructure layer is formed on the ingot surface.

A further object of the instant disclosure is to provide a manufacturing method of wafers, comprising the steps of: forming an ingot having an adhesive surface from a raw ingot; forming a nanostructure layer on the adhesive surface; providing an ingot-holder and forming a connecting layer on the nanostructure layer of the adhesive surface, where the connecting layer is used for fixing the ingot to the ingot-holder; and performing a slicing operation. Please note the terms "ingot" and "raw ingot" are used throughout the specification as general terms to describe the manufacturing process. Yet, industrial manufacturers may use different terms based on different crystallization status or stages of the manufacturing process. Nevertheless, the terms "ingot" and "raw ingot" include any variants any derivatives, any analogues, and the like.

A still further object of the instant disclosure is to provide a manufacturing method of wafers, comprising the steps of: forming an ingot by refining a raw ingot; forming a nanostructure layer on at least one surface of the ingot; providing an ingot-holder and forming a connecting layer on the nanostructure layer, where the connecting layer is used for fixing the ingot to the ingot-holder; and performing a slicing operation.

An additional object of the instant disclosure is to provide a wafer formed by slicing an ingot. The wafer has at least one nanostructure-topped side surface adjacent to the slicing path.

Based on the above, the instant disclosure utilizes a surface treatment method to change at least one side surface of the ingot by forming the nanostructure layer on the side surface, without changing the original surface properties of the ingot. This nanostructure layer is capable of improving the mechanical strength of the ingot to reduce the chipping issue during the slicing process.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The instant disclosure provides a nanostructuring process for an ingot surface and a wafer manufacturing method using the same. Before the ingot is being sliced, the nanostructuring process involves treating at least one surface of the ingot in forming a nanostructure layer thereon. This nanostructure layer is capable of dispersing external stress to reduce the chipping ratio during the slicing operation, thereby increasing the yield rate and quality of the wafers.

The nanostructuring process utilizes the wet etching technique to restructure the ingot surface. The formed nanostructure may have a needle-like shape or be cylindrical shaped. For the instant embodiment, the formed nanostructure has a grass-like shape and may be referred to as the silicon grass structure, or as black silicon. The term "black silicon" derives from the fact after the ingot has undergone surface treatment, the ingot will appear substantially black in color. The black silicon absorbs nearly all the light that hit it, thus the ingot has highly non-reflective surfaces. Alternatively, the ingot surface can be dry etched by using plasma.

Figure 1:
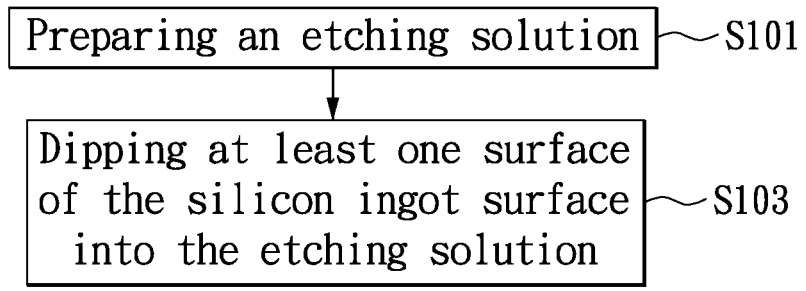
FIG. 1 is a flow chart showing a nanostructuring process of an ingot surface for the instant disclosure.

As shown in FIG. 1, the nanostructuring process includes the following steps:

Step S101: preparing an etching solution. In the instant embodiment, hydrofluoric acid (HF), water (solvent), silver nitrate ($AgNO_3$), and hydrogen peroxide ($H_2O_2$) are mixed in predetermined ratios to form the etching solution. It is worth noting that the concentrations of the ingredients for the etching solution may be changed as appropriate depending on the type of the manufacturing process. For the instant embodiment, the concentration of hydrofluoric acid is approximately 49% by weight, the molar concentration of silver nitrate is approximately 0.1M, and the concentration of hydrogen peroxide is approximately 39% by weight.

The above ingredients having aforementioned concentrations are mixed at a predetermined ratio and under a predetermined temperature to form the acidic etching solution for the ingot. For the instant embodiment, the volumetric ratio of hydrofluoric acid to water to silver nitrate to hydrogen peroxide is from about 20:40:1:4. The mixing process can be undertaken at a room temperature of approximately 20° C.

Alternatively, the etching solution may also be formed by mixing nitric acid, phosphoric acid, and a solvent at a predetermined ratio.

Step S103: the prepared etching solution is used to perform surface treatment of the ingot (such as a silicon ingot). For example, the operator can dip one or multiple surfaces of the silicon ingot into the etching solution to form a nanostructure layer 1011 (shown in FIGS. 7A and 7B) on the submerged surface(s). For the instant embodiment, one surface of the silicon ingot (to be later coated with a connecting layer 11) is dipped into the etching solution to perform the surface treatment step by means of wet etching technique. The immersing time it takes to form the nanostructure layer 1011 ranges approximately from 30 seconds to 5 minutes. For example, the formation of the desired nanostructures may take approximately 60 seconds. Physically, the nanostructure layer 1011 is a thin layer formed to a depth of a few nanometers or few tens of nanometers below the ingot surface. Therefore, the nanostructure layer 1011 does not induce any significant effect on the surface roughness of the ingot surface (to be discussed later in the specification).

Figure 2:
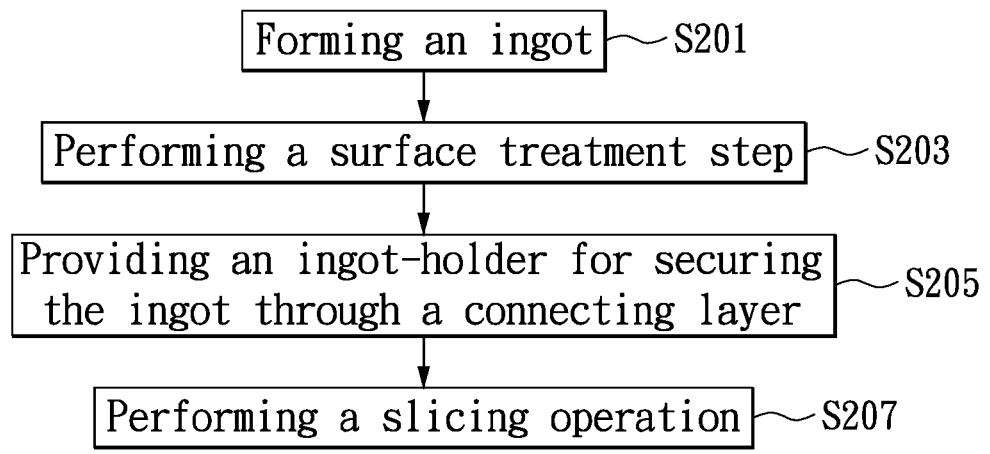
FIG. 2 is a flow chart showing a manufacturing method for wafers for the instant disclosure.
Figure 3A:
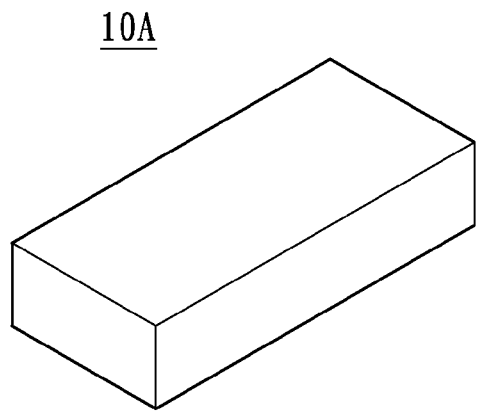
FIGS. 3A~3C show a manufacturing process of a multi-crystal ingot for the instant disclosure.
Figure 3B:
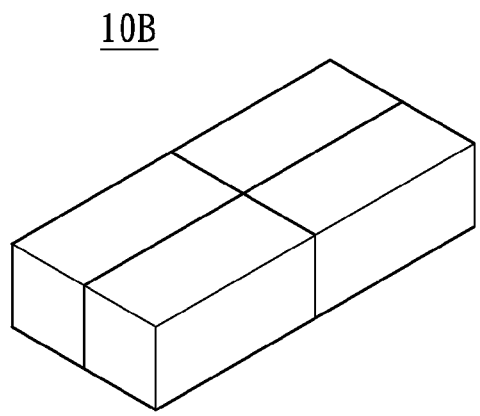
Figure 3C:
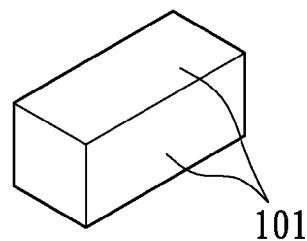

The descriptions provided hereinbelow relates to applying the abovementioned nanostructuring process to a wafer manufacturing method. Relevant experiments are conducted to provide concrete understanding of the effect of the instant disclosure. As shown in FIG. 2, the wafer manufacturing method includes the following steps:

Step S201: forming an ingot. In association with this step, please refer to FIGS. 3A~3C and 4A~4D. FIGS. 3A~3C show the perspective views of a multi-crystal ingot, while FIGS. 4A~4D show the perspective views of a single-crystal ingot. It is worth noting that the term "ingot" used throughout the specification is a general term and not limited to any specific manufacturing process. In FIGS. 3A~3C, FIG. 3A shows a multi-crystal silicon ingot 10A, which is a raw ingot. Then, as shown in FIG. 3B, this ingot 10A is converted into four blocks 10B using a process known as "squaring". Squaring is an abrasive sawing process. Next, as shown in FIG. 3C, the block 10B is polished to produce a final multi-crystal ingot 10C (the term "ingot" used throughout the specification refers to this final product). This multi-crystal ingot 10C can be utilized to manufacture wafers for solar energy application.

Figure 4A:
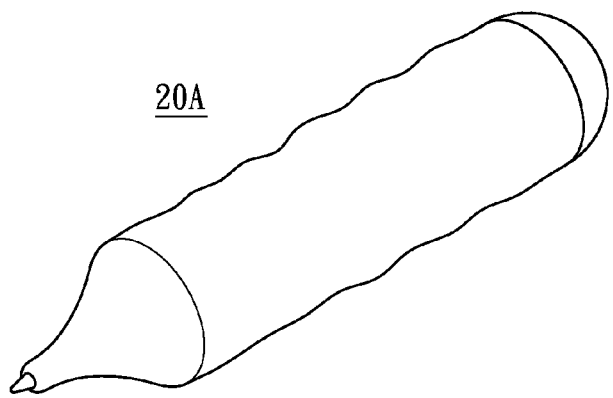
FIGS. 4A~4D show a manufacturing process of a single-crystal ingot for the instant disclosure.
Figure 4B:
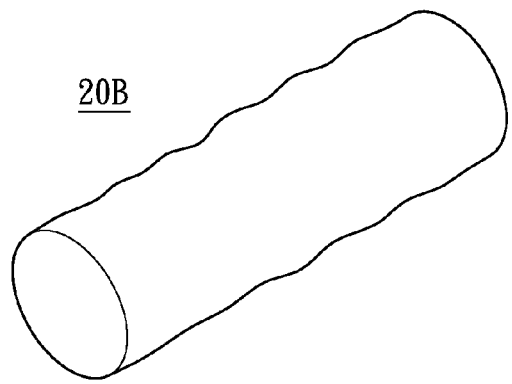
Figure 4C:
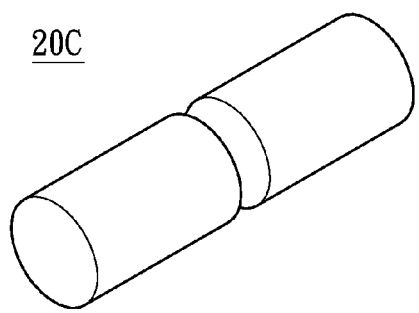
Figure 4D:
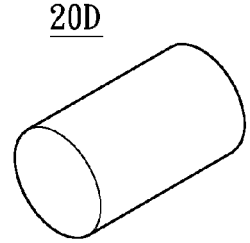

For the single-crystal ingot, its manufacturing process is described in FIGS. 4A~4D. A process known as "crystal pulling" is employed to produce a rod-like grown ingot 20A, as shown in FIG. 4A. Specifically speaking, the Czochralski (CZ) process, which is a crystal growth method, may be adopted for this step. For the Czochralski process, a seed crystal is first dipped into the molten silicon melted in a crucible, usually made of quartz. The quartz crucible and the seed crystal are then spun in the same or opposite directions while the seed crystal is slowly extracted. While the seed crystal is slowly pulled upwards and rotated simultaneously, the seed crystal acts as a nucleus for growing the single-crystal silicon to produce the grown ingot 20A. Alternatively, the float zone (FZ) crystal growth method may be selected to produce the grown ingot 20A. This grown ingot 20A is then refined in forming a final cylindrical ingot 20D (the term "ingot" used throughout the specification refers to this final product). For example, the ends of the grown ingot 20A are first "cropped" using either an annular or reciprocating saw. The resulting single-crystal ingot 20B is shown in FIG. 4B. This single-crystal ingot 20B is then polished and grinded to provide a smooth surface finish. The polished single-crystal ingot 20B now has appropriate cross-section and diameter. Next, the single-crystal ingot 20B is sliced in forming individual cylindrical blocks 20C. Lastly, the cylindrical block 20C undergoes a grinding process by using a grinding wheel to remove any surface irregularities or damages suffered during the slicing operation in obtaining the final cylindrical ingot 20D (the term "ingot" used throughout the specification refers to this final product).

Figure 5:
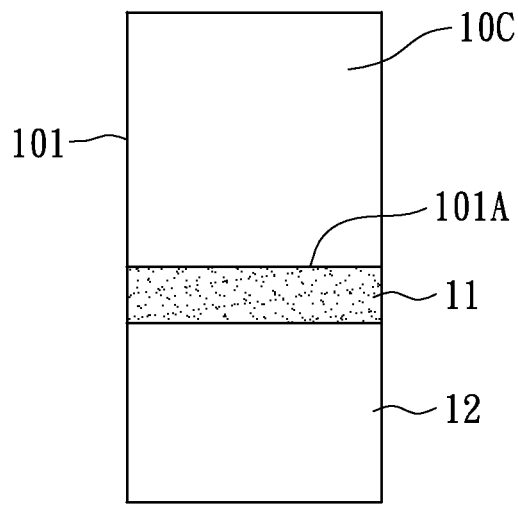
FIG. 5 shows a schematic view of the multi-crystal ingot (or ingot) affixed to an ingot-holder through a connecting layer of the instant disclosure.

For the orientation shown in FIG. 3C, the multi-crystal ingot 10C has four side surfaces 101 defined vertically between the top and bottom surfaces (only two side surfaces 101 can be seen in FIG. 3C). The operator can designate any one of the four side surfaces 101 as an adhesive surface 101A (as shown in FIG. 5). This adhesive surface 101A is to be coated with a connecting layer 11 for securing the ingot 10C to an ingot-holder 12 in preparation for subsequent slicing operation (details to be given later). The nanostructuring process of the instant disclosure is applicable to the adhesive surface 101A to reduce the chipping ratio of the ingot 10C during slicing operation.

Step S203: performing a surface treatment, which is referring to the aforementioned nanostructuring process (steps S101 and S103). As mentioned above, the surface treatment step begins with preparing the etching solution. For instance, hydrofluoric acid at a concentration of 49% by weight, silver nitrate having a molecular concentration of 0.1M, hydrogen peroxide having a concentration of 39% by weight, and water are mixed at a predetermined ratio and a predetermined temperature to form the etching solution. Alternatively, nitric acid, phosphoric acid, and a solvent can be mixed to form another type of etching solution. Then, the adhesive surface 101A is immersed into the etching solution to form the nanostructure layer 1011 thereon.

As mentioned previously, the connecting layer 11 must be formed on the adhesive surface 101A to secure the ingot 10C on the ingot-holder 12 for subsequent slicing operation. To show the surface treatment step does not negatively affect the surface properties of the adhesive surface 101A, such as to make sure the adhesiveness between the adhesive surface 101A and the connecting layer 11 is properly maintained, a surface roughness test is conducted for the surface-treated ingot (designated by experiments 1 and 2) and untreated ingot. This test is to verify the etching process used during the surface treatment step will not negatively impact the adhesiveness between the adhesive surface 101A and the connecting layer 11. The test result is shown in Table 1, where Ra is a roughness parameter that indicates the average height of the bumps on the measured surface, and Rmax refers to the highest peak among the bumps on the surface. As shown in Table 1, the surface roughness of the etched ingot does not vary significantly from untreated ingot. The test suggests the nanostructuring process of the instant disclosure would not impair the adhesiveness between the adhesive surface 101A and the connecting layer 11.

TABLE 1

|  | Ra (um) | Rmax (um) |
| --- | --- | --- |
| Untreated Ingot | 0.091 | 0.85 |
| Experiment 1 | 0.088 | 0.77 |
| Experiment 2 | 0.117 | 0.92 |

Step S205: providing the ingot-holder 12 (shown in FIG. 5) and forming the connecting layer 11 on the nanostructure layer 1011 of the adhesive surface 101A to secure the ingot 10C on the ingot-holder 12. Specifically speaking, the adhesive layer 101A can be coated with an adhesive paste such as wax or resin (e.g., epoxy adhesive) to form the connecting layer 11. This connecting layer 11 allows the ingot 10C to be secured to the ingot-holder 12. The ingot-holder 12 can be a plate or a pad, usually made of graphite, to support and fix the ingot 10C during the slicing operation.

S207: performing a slicing operation. For the instant embodiment, the ingot 10C is sliced into individual wafers through the use of an inner diameter saw or a wire saw. However, before the slicing operation begins, technique such as X-ray diffraction or parallel beams refraction can be used to verify the precise position of the ingot 10C relative to the slicing device.

Alternatively, surface treatment of the ingot through etching (step S103) can be done to all four side surfaces 101 and not restricted to the adhesive surface 101A. In other words, the nanostructure layer 1011 can be formed on every side surface 101 of the ingot.

By capable of forming the nanostructure layer 1011 on the adhesive surface 101A, the mechanical strength of the adhesive surface 101A can be strengthened. The increased mechanical strength can reduce the chipping ratio of the ingot during the slicing operation. From a test trial, the chipping ratio can be reduced to zero. Conversely, the chipping ratio of conventional untreated ingot is approximately 1.5~2.0%. Therefore, it is obvious that the nanostructuring process of the instant disclosure can effectively increase the yield rate of wafer manufacturing.

Figure 6:
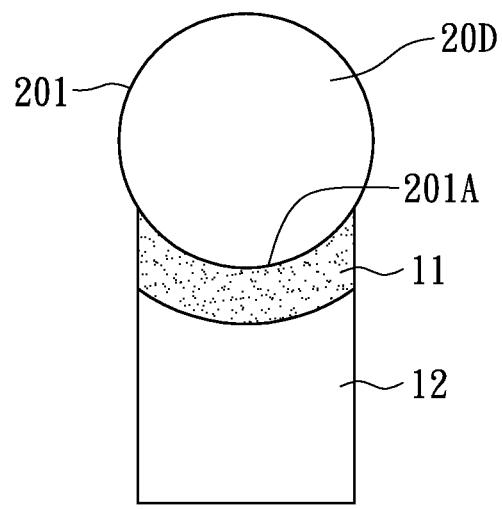
FIG. 6 shows a schematic view of a cylindrical ingot (a different shape of ingot) affixed to the ingot-holder through the connecting layer of the instant disclosure.

As shown in FIG. 6, the cylindrical ingot 20D is fixed to the ingot-holder 12 through the connecting layer 11. The cylindrical ingot 20D has a side surface 201, where the operator can select a portion of the side surface 201 as the adhesive surface 201A. The adhesive surface 201A will undergo the nanostructuring process, before being coated with the connecting layer 11 for securing to the ingot-holder 12 to perform the slicing operation. Like the block ingot, the adhesive surface 201A topped with the nanostructure layer 1011 allows the adhesive surface 201A to have higher mechanical strength while reducing the chipping ratio.

Figure 7A:
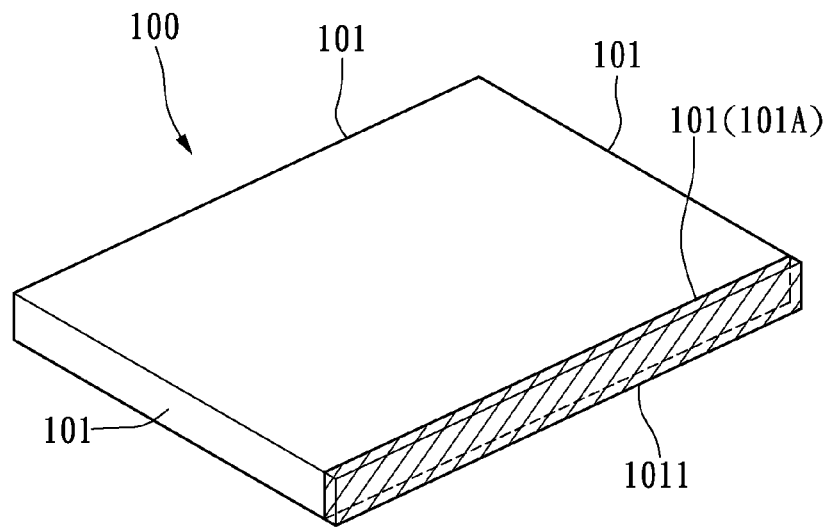
FIG. 7A shows a perspective view of a wafer for a first embodiment of the instant disclosure, where a nanostructure layer is formed on a single side surface of the wafer.
Figure 8A:
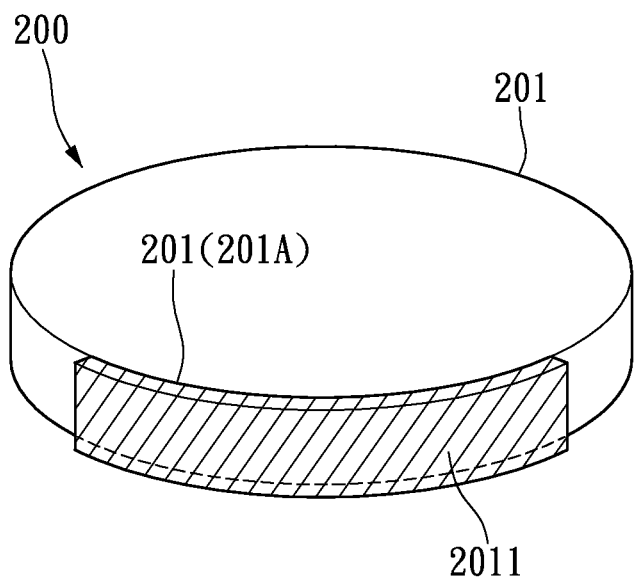
FIG. 8A shows a perspective view of a wafer for a second embodiment of the instant disclosure, where the nanostructure layer is formed on a portion of the side surface of the wafer.

Thus, before the slicing operation begins, the nanostructure layer 1011 is formed on at least one side surface (as shown in FIG. 5) or a portion of the side surface (as shown in FIG. 6) of the ingot. The nanostructures are preferably arranged adjacent to the path traveled by the slicing tool, such that the chipping ratio of the ingot can be reduced during slicing. In addition, the formed nanostructures do not negatively affect the surface roughness of the adhesive surface 201A. Therefore, the adhesiveness between the adhesive surface 201A and the connecting layer 11 can be properly maintained. In other words, the nanostructuring process of the instant disclosure is suitable for applying to existing wafer manufacturing method, without adjusting or changing the current wafer manufacturing procedures. Based on the foregoing, the nanostructuring process and wafer manufacturing method using the same provided by the instant disclosure can reduce the edge chipping ratio during the slicing stage of the ingot while increase the yield rate. On the other hand, each of the side surfaces 101 (as shown in FIG. 5) or the entire side surface 201 (as shown in FIG. 6) can undergo the nanostructuring process in forming respective nanostructure layer 1011 to reduce the chipping ratio during slicing. After slicing, a wafer, generally designated by the numeral 100 and 200, can be formed as shown in FIGS. 7A and 8A, respectively. The wafer 100 is defined by the top and bottom surfaces with adjacent side surfaces 101. Similarly, the wafer 200 is defined by the top and bottom surfaces with an adjacent side surface 201. The angles formed between the side surfaces 101 and adjacent top and bottom surfaces range from 0 to 180 degrees, and same angular configuration is applicable to the wafer 200. For example, wafers 100 and 200 can have right-angled or rounded edges. It is worth noting that the side surfaces 101 and 201 are adjacent to the beginning and end points of slicing for respective wafers.

Figure 7B:
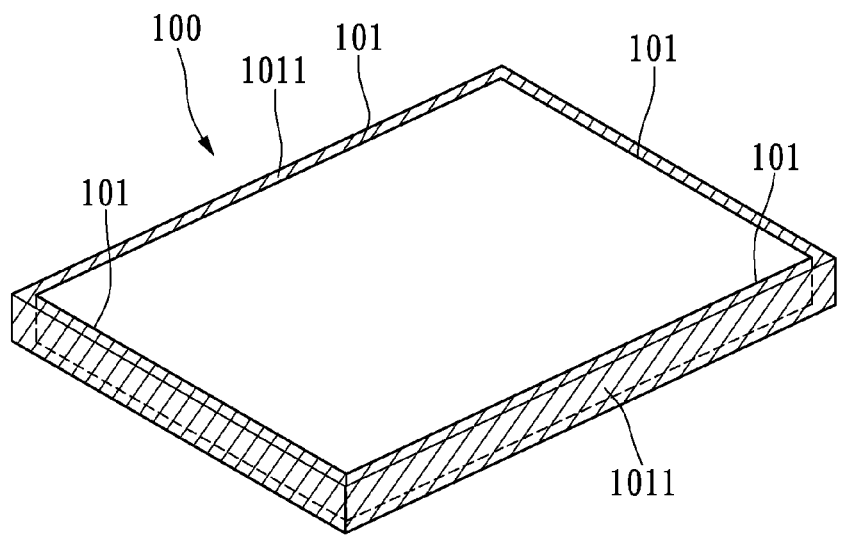
FIG. 7B shows a perspective view of the wafer for the first embodiment of the instant disclosure, where the nanostructure layer is formed on a plurality of side surfaces of the wafer.
Figure 8B:
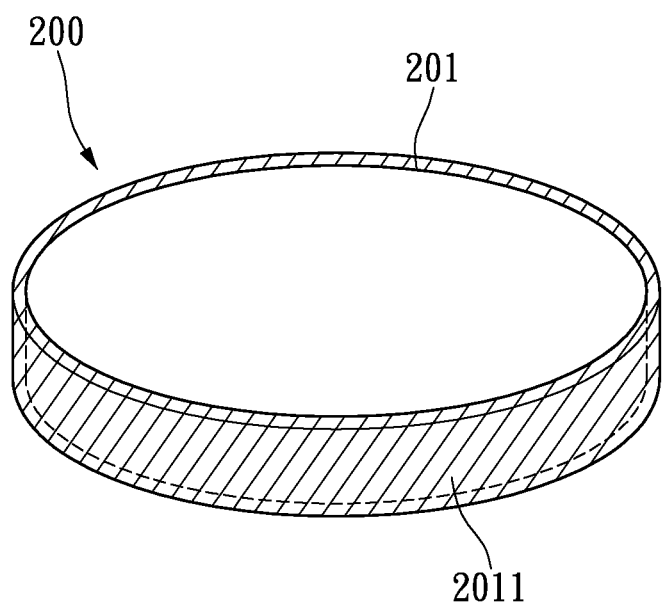
FIG. 8B shows a perspective view of the wafer for the second embodiment of the instant disclosure, where the nanostructure layer is formed on the entire side surface of the wafer.

Please refer back to FIG. 7A, which shows the wafer 100 (also known as a chip) formed after slicing the multi-crystal ingot 10C illustrated in FIG. 5. The thin slice of wafer 100 has multiple (such as four) side surfaces 101, where each side surface 101 is adjacent to at least one slicing path traveled by the slicing tool during the slicing operation of the multi-crystal ingot 10C. One of the side surfaces 101 is referred to as the adhesive surface 101A topped with the nanostructure layer 1011. Whereas FIG. 7B shows the nanostructure layer 1011 is formed on all four side surfaces 101 of the wafer 100. Furthermore, FIG. 8 shows the thin slice of circular-shaped wafer 200 formed after slicing the cylindrical ingot 20D in FIG. 6. A portion of the side surface 201 of the wafer 200 is referred to as the adhesive surface 201A topped with a nanostructure layer 2011 based on the aforementioned nanostructuring process. Whereas FIG. 8B shows the nanostructure layer 2011 is pre-formed on the entire side surface 201 of the wafer 200.

Regarding the physical properties of the nanostructure layers 1011 and 2011, the nanostructure layers 1011 and 2011 are inherently defined with load-concentrating areas. Generally speaking, during the slicing operation, the applied stress on the wafers 100 and 200 are dispersed on the load-concentrating areas over the entire etched side surfaces 101 and 201. The resulting stress distribution is a plane load instead of a line load or a point load. When the tension force is exerted on the wafers 100 and 200, the applied stress will be distributed on the nanostructure layers 1011 and 2011 over the entire side surfaces 101 and 201, respectively, to prevent the edges of the wafers from chipping or cracking. In other words, the nanostructure layers 1011 and 2011 of the side surfaces 101 and 201 of the wafers 100 and 200, respectively, can effectively increase the cracking resistance of the wafers. Moreover, the nanostructure layers 1011 and 2011 allow the wafers 100 and 200 to increase the load bearing capability and achieve greater bending capability. Therefore, the wafers 100 and 200 of the instant disclosure can avoid chipping or cracking during various refining processes. Thus, the wafers 100 and 200 can have better physical properties and broader application range. According to experimental results, the maximum permissible force on the conventional wafer is approximately 2N, while the maximum permissible force on of the wafers 100 and 200 of the instant disclosure each is approximately 3N. The maximum permissible force is adjustable based on the time it takes to grow the nanostructure layers 1011 and 2011. Thus, it is obvious that the nanostructure layers 1011 and 2011 can enhance the mechanical strength and cracking resistance of the wafers 100 and 200.

Although the preceding embodiments utilize silicon ingots, however, the material selection is not limited thereto. For example, an ingot made of gallium arsenide may be used. Similarly, different etching agent may be used depending on the type of the ingot, where the etching agent may vary in composition, composition ratio, and/or acidity. It is worth noting that other suitable methods, such as dry etching by using plasma, may be employed to conduct the nanostructuring process. In practice, the manufactured wafers 100 and 200 can be used in the fields such as solar cells, LEDs, and semiconductor industries.

The instant disclosure has the following advantages. Namely, the surface treatment method provided by the instant disclosure enables the ingot to grow a thin nanostructure layer on its surfaces. The nanostructuring process increases the mechanical strength of the surfaces of the ingot, such that edge chipping occurs less frequently during slicing. After the slicing operation is completed, the nanostructure layer enables the wafer to achieve greater load bearing capability and mechanical strength against cracking. In addition, the bending capability of the wafer is also improved allowing greater application range.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A silicon wafer formed by slicing a silicon ingot, wherein the wafer has at least one side surface adjacent to the slicing path that is topped with a nanostructure layer, wherein the nanostructure layer has a cylindrical shape and is present only on the at least one side surface adjacent to the slicing path.

2. The wafer of claim 1, wherein the nanostructure layer is formed on the entire or a portion of the side surface.

* * * * *